(12) United States Patent
Kraus et al.

(10) Patent No.: US 8,900,897 B2
(45) Date of Patent: Dec. 2, 2014

(54) MATERIAL WITH TUNABLE INDEX OF REFRACTION

(71) Applicant: Intermolecular Inc., San Jose, CA (US)

(72) Inventors: Philip Kraus, San Jose, CA (US); Thai Cheng Chua, Cupertino, CA (US); Yoga Saripalli, Sunnyvale, CA (US)

(73) Assignee: Intermolecular, Inc., San Jose, CA (US)

( * ) Notice: Subject to any disclaimer, the term of this patent is extended or adjusted under 35 U.S.C. 154(b) by 10 days.

(21) Appl. No.: 13/738,684

(22) Filed: Jan. 10, 2013

(65) Prior Publication Data

US 2014/0191262 A1   Jul. 10, 2014

(51) Int. Cl.
*H01L 21/00* (2006.01)
*H01L 33/00* (2010.01)
(Continued)

(52) U.S. Cl.
CPC .............. *H01L 33/60* (2013.01); *H01L 31/00* (2013.01); *H01L 33/44* (2013.01); *H01S 5/00* (2013.01); *Y10S 438/952* (2013.01)
USPC .............. 438/29; 438/69; 438/72; 438/636; 438/952; 438/22; 257/98; 257/103; 257/84; 257/E33.069; 257/E21.006; 359/248; 359/328; 359/586; 359/315; 359/652

(58) Field of Classification Search
CPC ..... H01L 33/10; H01L 33/06; H01L 33/0012; H01L 33/60; H01L 33/44; H01L 33/46; H01L 33/105; H01L 33/32; H01L 33/465; H01L 33/405; H01L 33/00; H01L 27/3202; H01L 27/3204; H01L 27/32; H01L 27/15; H01L 27/14; H01L 27/1446; H01L 27/156; H01L 31/042; H01L 31/0232; H01L 29/22; H01L 29/24; H01L 29/20; B82Y 30/00

USPC ........... 438/69, 29, 72, 636, 952, 22; 257/98, 257/103, 40, 96, 97, 432, 437, 79, 80–84, 257/87, 76, 13, 89, E51.021, E33.069, 257/E33.005, E33.045, E33.077, E33.068, 257/E33.062, E21.006, E29.089, E29.094, 257/E29.1, E21.029; 359/248, 328, 326, 359/315, 584, 586, 652
See application file for complete search history.

(56) References Cited

U.S. PATENT DOCUMENTS 6,034,979 A   3/2000   Karube et al.
6,452,215 B1   9/2002   Sato
(Continued)

FOREIGN PATENT DOCUMENTS

EP   0621646 A2   10/1994

OTHER PUBLICATIONS

Schubert, E.Fred; Light-Emitting Diodes; 2nd Edition; Jun. 19, 2006; Cambridge University Press; Chapters 10.1 and 10.3, 17 pages.
(Continued)

*Primary Examiner* — Choung A Luu
*Assistant Examiner* — Moazzam Hossain

(57) ABSTRACT

Devices are described including a component comprising an alloy of AlN and AlSb. The component has an index of refraction substantially the same as that of a semiconductor in the optoelectronic device, and has high transparency at wavelengths of light used in the optoelectronic device. The component is in contact with the semiconductor in the optoelectronic device. The alloy comprises between 0% and 100% AlN by weight and between 0% and 100% AlSb by weight. The semiconductor can be a III-V semiconductor such as GaAs or AlGaInP. The component can be used as a transparent insulator. The alloy can also be doped to form either a p-type conductor or an n-type conductor, and the component can be used as a transparent conductor. Methods of making and devices utilizing the alloy are also disclosed.

14 Claims, 5 Drawing Sheets

(51) Int. Cl.
   *G02B 1/10* (2006.01)
   *G02F 1/15* (2006.01)
   *H01L 33/60* (2010.01)
   *H01L 31/00* (2006.01)
   *H01L 33/44* (2010.01)
   *H01S 5/00* (2006.01)

(56) References Cited

U.S. PATENT DOCUMENTS

| | | | |
|---|---|---|---|
| 8,053,972 B2 | 11/2011 | Bawendi et al. | |
| 2005/0012106 A1* | 1/2005 | Fathimulla et al. | 257/80 |
| 2008/0043796 A1* | 2/2008 | Jikutani et al. | 372/50.11 |
| 2010/0140585 A1* | 6/2010 | Bawendi et al. | 257/13 |
| 2010/0187550 A1 | 7/2010 | Reed et al. | |
| 2010/0219767 A1 | 9/2010 | Pumyea et al. | |
| 2010/0220384 A1* | 9/2010 | Kimura et al. | 359/328 |
| 2010/0283072 A1 | 11/2010 | Kazlas et al. | |
| 2011/0198515 A1 | 8/2011 | Wraback et al. | |
| 2012/0132930 A1* | 5/2012 | Young et al. | 257/84 |
| 2013/0056777 A1* | 3/2013 | Jorgenson | 257/98 |

OTHER PUBLICATIONS

Peng, T., et al.; Band Gap Bowing and Refractive Index Spectra of Polycrystallin AlxIn1-xN Films Deposited by Sputtering; Aug. 28, 1997; Appl. Phys. Lett.; American Institute of Physics, pp. 2439-2441.

Dridi, Z., et al.; First-principles investigation of lattice constants and bowing parameters in wurtzite AlxGa1—xN, InxGa1—xN and InxAl1—xN alloys; Aug. 8, 2003; IOP Publishing Ltd.; Semiconductor Science and Technology, pp. 850-856.

Takayama, T., et al.; Theoretical predictions of unstable two-phase regions in wurtzite group-IIInitride-based ternary and quaternary material systems using modified valence force field model; Sep. 1, 2001; Journal of Applied Physics, vol. 90, No. 5; American Institute of Physics, pp. 2358-2369.

Boguslawski, P., et al.; Doping properties of C, Si, and Ge impurities in GaN and AlN; Oct. 15, 1997; The American Physical Society; Physical Review B, vol. 56, No. 15, pp. 9496-9505.

Gessman, T., et al.; AlGaInP light-emitting diodes with omni-directionally reflecting submount; 2003; Proceedings of SPIE, vol. 4996, pp. 26-39.

Kim, J., et al.; Omni-directional reflectors for light-emitting diodes; 2006; Proceedings of SPIE, vol. 6134, 12 pages.

\* cited by examiner

MATERIAL WITH TUNABLE INDEX OF REFRACTION

FIELD OF THE INVENTION

One or more embodiments of the present invention relate to materials having a tunable index of refraction and structures made from the materials.

BACKGROUND

Over time the internal quantum efficiency of light-emitting diodes (LEDs) has become very good. For example III-V devices made by metal-organic chemical vapor deposition (MOCVD) typically have internal quantum efficiencies of about 90%. However, the external quantum efficiency is much lower due to poor light transmission from the semiconductor to the air. This is due to several problems, given here by example for AlGaInP devices. Similar issues apply to LEDs, lasers, and other optoelectronic devices made from any semiconductor with a high index of refraction.

The absorbing nature of the most common substrates for AlGaInP requires engineering structures in the film stack to reflect the emitted light away from the substrate. The doped semiconductor layers deposited on top of the light emitting layers are also absorbing. These doped layers are used for improving current spreading and achieving good contact resistance to the metallic contacts on the device. The high index of refraction of the AlGaInP semiconductor (n≈3.3) and the low index of refraction of air (n=1) causes significant reflection of the emitted light if there is no index-matched and non-absorbing optical transition between the semiconductor and the air. Suitable materials for index-matching are difficult to find, and commonly used materials are not matched.

SUMMARY

Compositions, optoelectronic devices, and methods for making the devices are disclosed. Optoelectronic devices comprise a first component and a second component in optical contact. The first component comprises a semiconductor, and the second component comprises an alloy of AlN and AlSb having a refractive index approximately the same as that of the first component, and having high transparency at wavelengths of light used in the optoelectronic device. In some embodiments, the alloy has a refractive index substantially the same as that of the first component. The alloy comprises between 0% and 100% AlN by mole fraction and between 0% and 100% AlSb by mole fraction. In some embodiments, the semiconductor is a III-V semiconductor. In some embodiments, the III-V semiconductor is GaAs or AlGaInP and the alloy consists of about 35 mole % AlN and about 65 mole % AlSb.

In some embodiments, the second component can be used as a transparent insulator. In some embodiments, the second component can be used as a transparent conductor. When used as a conductor, the alloy further comprises a dopant to make the alloy conductive. The conductivity can be either n-type or p-type. Examples of n-type dopants include Ge, Si, and Sn. Examples of p-type dopants include Zn and Mg. The alloy can be deposited by any processing method including physical vapor deposition (PVD), chemical vapor deposition (CVD), atomic layer deposition (ALD), among others. The optoelectronic device can be a light-emitting device such as an LED or laser, or it can be a light-sensing device.

The second component can be used in conjunction with an adjacent metal layer to form an omnidirectional reflector. A set of conductive vias can be used to provide conductivity between the metal layer and the first component (semiconductor). Alternatively, the alloy can be made conductive using n-type or p-type dopants. Examples of metal layers are Ag and Al.

Optical devices are also disclosed. In some embodiments, distributed Bragg reflectors can be made comprising a plurality of layer pairs, wherein each pair comprises a first layer comprising AlN and a second layer comprising AlSb. Each layer has a thickness of $\lambda/4n_i$, where $\lambda$ is the peak wavelength of an optoelectronic device, and $n_i$ is the index of refraction of that layer. Optoelectronic devices comprising the distributed Bragg reflectors are also disclosed.

Methods of making optoelectronic devices are disclosed comprising providing an optoelectronic device comprising a semiconductor, and placing a transparent material adjacent to and in optical contact with the semiconductor material boundary, wherein the transparent material comprises an alloy of AlN and AlSb having an index of refraction approximately the same as the index of refraction of the semiconductor material. Optoelectronic devices made according to some embodiments of the invention exhibit reduced reflections at the semiconductor material boundary. In some embodiments, the alloy has a refractive index substantially the same as that of the first component. A dopant can be added to the alloy sufficient to make the alloy conductive. The alloy can be deposited as a layer by PVD, ALD, CVD, and other processes. In some embodiments, the semiconductor is a III-V semiconductor. In some embodiments, the III-V semiconductor is GaAs or AlGaInP and the alloy consists of about 35 mole % AlN and about 65 mole % AlSb.

In some embodiments, methods of making optoelectronic devices are disclosed wherein a first component is formed comprising a semiconductor material, and a second component is formed comprising an alloy of AlN and AlSb in optical contact with the first component. The second component has an index of refraction approximately the same as that of the first component, and has high transparency at wavelengths of light emitted or detected by the optoelectronic device. In some embodiments, the alloy has a refractive index substantially the same as that of the first component. As a result, the reflection of light at the boundary between the two components is reduced compared to typically used transparent materials having unmatched indices of refraction. A dopant can be added to the alloy sufficient to make the alloy conductive. The optoelectronic device made by all methods can be an LED.

DETAILED DESCRIPTION

It must be noted that as used herein and in the claims, the singular forms "a," "and" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. The terms "about" and "approximately" generally refers to ±10% of a stated value. The term "substantially the same as" generally means that the two quantities compared are within 1% of each other.

Definitions

As used herein, the term "alloy" refers to a mixture of two or more materials that is sufficiently intimate that the material shows no visible boundaries between component materials, and no boundaries bend or diffract light passing through the alloy. The notation used herein uses a hyphen between the component materials, e.g., AlN—AlSb. Materials that are described and/or notated as non-stoichiometric compounds (e.g., $AlN_xSb_{1-x}$) are also considered to be "alloys" as used herein.

As used herein, the term "component" refers to a portion of material used in an optoelectronic device. Components can include barrier layers, electrodes, lenses, insulators, and the like. A component may be in the form of a layer, but is not restricted to layers.

As used herein the term "conductor" refers to a material through which electrons are intended to flow with non-negligible current in an electronic or optoelectronic device. The resistivity of the conductor can vary and may be large as long as electrical current is intended to flow through the material. For example, if the conduction path is short (e.g., through the thickness of a thin film), then a relatively resistive material may function adequately as a conductor, while for longer paths (connections to external devices and circuits), much lower resistivities may be required.

Figure 1:
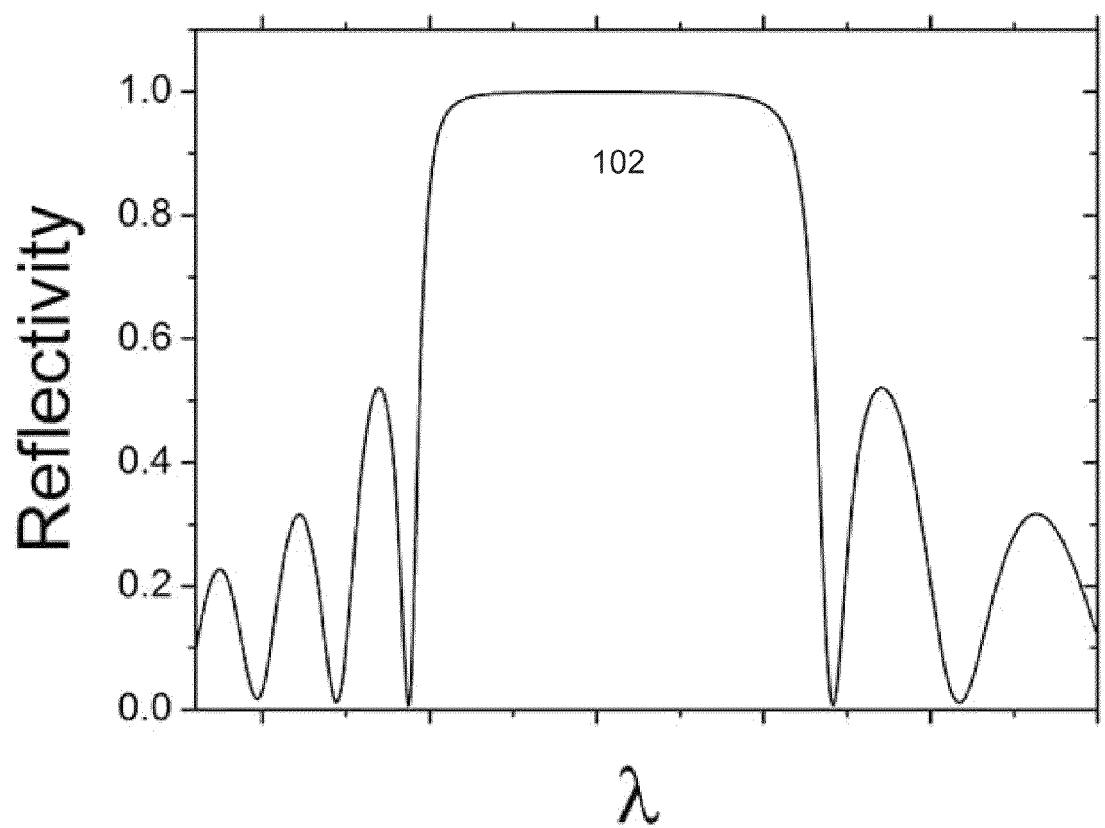
FIG. 1 shows typical reflectance characteristics for a distributed Bragg reflector.

As used herein, the term "distributed Bragg reflector" refers to a structure formed from multiple layers of alternating materials with different indices of refraction. Each layer boundary causes a partial reflection of an optical wave. For waves whose wavelength is close to four times the optical thickness of the layers, the many reflections combine with constructive interference, and the layers act as a high-quality reflector (see FIG. 1). The range of wavelengths that are reflected with high efficiency is called the "stopband." Within this range of wavelengths, light is "forbidden" to propagate in the structure.

As used herein, the term "extinction coefficient" refers to the imaginary part of the complex index of refraction.

As used herein the term "insulator" refers to a dielectric material used to separate two or more conduction paths with an electronic or optoelectronic device. The resistivity of the insulator material is sufficiently large that any leakage currents through the insulator are much less than currents through the adjacent conductors.

As used herein, the term "negligible extinction coefficient" is used to describe a material having an extinction coefficient of less than 0.02 at the wavelength of interest. In some embodiments, the extinction coefficient is ≤0.001. A material having a negligible extinction coefficient at wavelengths of interest is understood to be transparent.

As used herein, the term "omnidirectional reflector" refers to a structure which reflects light with substantially equal efficiency over a broad range of incident angles. Polished metals are generally omnidirectional reflectors.

As used herein, the terms "operating wavelengths" or "wavelengths of interest" refer to wavelengths of light emitted or detected by an optoelectronic device.

As used herein, the term "optical contact" refers to intimate contact between two solid materials such that there is negligible intervening gap, space, liquid, or gas between the two materials. Light moving from one material to the other refracts and reflects based solely on the differences between the two material indices of refraction.

The present invention discloses methods, compositions, and articles of manufacture employing alloys comprising AlN and AlSb. The AlN—AlSb alloys exhibit a tunable index of refraction between about 2.2 and about 4.0 (at ~630 nm). The alloys are generally transparent, having a negligible extinction coefficient at wavelengths of interest, such as the visible and near IR spectrum, for example, at the emission wavelengths of particular LEDs (e.g., red and IR LEDs made from AlGaInP). The alloys also have a moderate bandgap (~2 eV to ~6 eV), and exhibit good insulating characteristics when undoped. Alloys with these characteristics are useful in dielectric layers in LED devices and in general for index matching at the boundary of semiconductors such as AlGaInP in III-V optoelectronic devices such as LEDs. The alloys can be placed in optical contact with the semiconductor to provide index matching at the boundary.

Additionally, because AlN and AlSb are semiconductors, it is possible to dope them and achieve a type of transparent conducting material. Doped AlN—AlSb alloys can be used, for example, as a new class of high-refractive-index, transparent conductors for use in top contacts to LEDs or lasers. The transparent and conducting AlN—AlSb alloys can be used alone or in a stack with more conventional transparent conducting oxides (such as indium tin oxide or indium zinc oxide). For n-type conductivity, the AlN—AlSb alloy can be doped with Ge, Si or Sn, for example. For p-type conductivity, the AlN—AlSb alloy can be doped with Zn or Mg, for example.

AlN, AlSb, and alloys thereof are known in the art (U.S. Pat. Nos. 6,452,215 and 8,053,972, U.S. Patent Application Publication Nos. 2010/0187550 and 2011/0198515, European Patent EP0621646 B1). However, heretofore, AlN, AlSb, and alloys thereof have not been used as optical materials for transparent dielectrics/insulators or transparent conductors, or for composite structures such as reflectors and the like. Rather, the prior art has exploited the semiconductive electrical properties and lattice dimensions of the alloys.

The AlN—AlSb alloys (both doped and undoped) can be deposited by a number of deposition methods, including ALD, CVD, plasma-enhanced CVD (PECVD), and PVD. In some embodiments, PVD is a preferred method because a wider range of compositions in the alloy system can be achieved. There are reports in the literature of immiscibility at high AlN concentrations in the AlN—AlSb system, and the co-deposition of AlN and AlSb can be far from equilibrium. PVD is a convenient means for depositing well-mixed alloys despite the immiscibility.

Optoelectronic devices are disclosed comprising a first component and a second component in optical contact. The first component comprises a semiconductor, and the second component comprises an alloy of AlN and AlSb having a refractive index approximately the same as that of the first component, and having high transparency at wavelengths of light used in the optoelectronic device. In some embodiments, the alloy has a refractive index substantially the same as that of the first component. The alloy comprises between 0% and 100% AlN by mole fraction and between 0% and 100% AlSb by mole fraction. For example, for a semiconductor having a refractive index of 2.6 at 800 nm, an alloy comprising approximately 65% AlN and 35% AlSb can be used. For a semiconductor having a refractive index of 2.2 at 800 nm, an alloy comprising approximately 95% AlN and 5% AlSb can be used. For a semiconductor having a refractive index of 3.0 at 600 nm, an alloy comprising approximately 55% AlN and 45% AlSb can be used. For a semiconductor having a refractive index of 2.25 at 1500 nm, an alloy comprising approximately 90% AlN and 10% AlSb can be used.

In some embodiments, the alloy consists of AlN and AlSb. The percentage of AlN can be used to tune the index of refraction. In some embodiments the percentage of AlN is between 0% and 5%. In some embodiments the percentage of AlN is between 5% and 10%. In some embodiments the percentage of AlN is between 10% and 15%. In some embodiments the percentage of AlN is between 15% and 20%. In some embodiments the percentage of AlN is between 20% and 25%. In some embodiments the percentage of AlN is between 25% and 30%. In some embodiments the percentage of AlN is between 30% and 35%. In some embodiments the percentage of AlN is between 35% and 40%. In some embodiments the percentage of AlN is between 40% and 45%. In some embodiments the percentage of AlN is between 45% and 50%. In some embodiments the percentage of AlN is between 50% and 55%. In some embodiments the percentage of AlN is between 55% and 60%. In some embodiments the percentage of AlN is between 60% and 65%. In some embodiments the percentage of AlN is between 65% and 70%. In some embodiments the percentage of AlN is between 70% and 75%. In some embodiments the percentage of AlN is between 75% and 80%. In some embodiments the percentage of AlN is between 80% and 85%. In some embodiments the percentage of AlN is between 85% and 90%. In some embodiments the percentage of AlN is between 90% and 95%. In some embodiments the percentage of AlN is between 95% and 100%.

The alloys can be tuned for an index of refraction in a range from about 2.2 to 4.0, greatly extending the range provided by materials commonly used as transparent insulators in the prior art such as $SiO_2$ (n=1.5), $Al_2O_3$ (n=1.8), $Si_3N_4$ (n=2), and $TiO_2$ (n=2.5). The alloys can thereby provide index matching and reduced reflection compared to structures using non-matched materials such as those listed above. In some embodiments, the semiconductor is a III-V semiconductor. In some embodiments, the III-V semiconductor is GaAs or AlGaInP. In some embodiments, the second component can be used as a transparent insulator. In some embodiments, the second component can be used as a transparent conductor. As a conductor, the alloy further comprises a dopant as noted above to makes the alloy conductive. The optoelectronic device can be a light-emitting device such as an LED or laser, or it can be a light-sensing device.

Methods of making optoelectronic devices are disclosed. In some embodiments, the methods comprise placing a transparent material adjacent to and in optical contact with a semiconductor material boundary in an optoelectronic device, wherein the transparent material comprises an alloy of AlN and AlSb having an index of refraction approximately the same as the index of refraction of the semiconductor material. In some embodiments, the alloy has a refractive index substantially the same as that of the first component. A dopant can be added to the alloy sufficient to make the alloy conductive. The alloy can be deposited as a layer by any convenient method such as PVD, ALD, CVD, etc. In some embodiments, the semiconductor is a III-V semiconductor. In some embodiments, the III-V semiconductor is GaAs or AlGaInP and the alloy consists of about 35 mole % AlN and about 65 mole % AlSb.

In some embodiments, the methods comprise forming a first component comprising a semiconductor material, and forming a second component comprising an alloy of AlN and AlSb in optical contact with the first component. The second component has an index of refraction approximately or substantially the same as that of the first component, and has high transparency at wavelengths of light emitted or detected by the optoelectronic device. As a result, the reflection of light at boundary between the two components is reduced compared to typically used transparent materials having unmatched indices of refraction. A dopant can be added to the alloy sufficient to make the alloy conductive. The optoelectronic device made by all methods can be an LED.

Applications

Enhanced Light Extraction

Light extraction from optoelectronic devices such as LEDs and lasers is complicated by the high index of refraction of the III-V semiconductor materials used. A typical index of refraction is 3.3 for devices that emit in the yellow, orange, red, and infrared portion of the electromagnetic spectrum. Large reflection of the emitted light occurs in III-V devices at the semiconductor-air boundary due to the index of refraction mismatch between the semiconductor (n≈3.3) and air (n=1). Transparent materials (both insulating and conductive) with index of refraction tunable from the relatively high values of III-V semiconductors (~3.3) to lower values (n<2) typical of insulating oxides such as $Al_2O_3$ (n=1.8) or $SiO_2$ (n=1.5) are useful to enable efficient light extraction by reducing internal reflection. Such materials are not currently in use.

For devices that use an internal reflector, the ability to use a material with index of refraction matched to the semiconductor is of value in optoelectronic device design. For devices that use a distributed Bragg reflector (DBR), the optical characteristics are improved by having a high contrast in the index of refraction for the two material layers in the DBR. In all cases, it is useful if the insulating material with tunable index has a negligible extinction coefficient at operating wavelengths so that there is negligible absorption of the generated light in the insulating material.

Typical transparent conductive films used in the industry are oxides (transparent conducting oxides (TCOs)) such as indium tin oxide and doped zinc oxide. These oxides are not index matched to the semiconductors used in III-V devices; the typical index of refraction for TCOs is about 2. High-index transparent conducting films with a tunable index of refraction create new opportunities to engineer improved light coupling from III-V optoelectronic devices to lower index media such as air. Accordingly, the new tunable high-index-of-refraction alloys described herein can be used to provide improved light extraction compared to prior art materials.

High-Index-of-Refraction Insulators

Insulators having a high index of refraction are not common; typical insulators commonly used in the semiconductor industry such as $SiO_2$ (n=1.5), $Al_2O_3$ (n=1.8), $Si_3N_4$ (n=2), and $TiO_2$ (n=2.5) have lower index of refraction than the alloy disclosed herein. A deposited dielectric with tunable index of refraction and with negligible absorption is not currently used in III-V optoelectronic devices and would enable better index matching to semiconductors having a higher index of refraction. Improved light extraction can be achieved by maximizing transmittance and minimizing reflectance at semiconductor-insulator interfaces. Accordingly, the new tunable alloys comprising AlN and AlSb described herein can be used to provide high-index-of-refraction insulators that can be index matched to III-V semiconductors.

Transparent Conductors

As noted above, AlN and AlSb are semiconductors that can be doped to make them conductive. Conductive layers of AlN, AlSb, and alloys thereof can be used to provide novel transparent conducting materials that can be index matched to adjacent semiconductor layers in III-V optoelectronic devices. These transparent conductive layers can provide improved light extraction by maximizing transmittance and minimizing reflectance at semiconductor-conductor interfaces. Accordingly, the new tunable alloys comprising AlN and AlSb described herein can be used to provide high-index-of-refraction conductors that can be index matched to III-V semiconductors.

Distributed Bragg Reflectors

Distributed Bragg Reflectors (DBRs) are multilayers of two alternating materials with differing indices of refraction $n_1$ and $n_2$ and thickness $\lambda/4n_i$ (where $\lambda$ is the wavelength being used and $n_i$ [equal to either $n_1$ or $n_2$] is the index of refraction of a layer). DBRs are designed to have high reflection over a range of wavelengths known as the "stopband" 102 as shown schematically in FIG. 1. The reflectivity of a DBR increases with the number of repeats of the multilayer and with the difference in the index of refraction between the two layer materials in the DBR. The width of the stopband is proportional to the difference between the index of refraction of the two materials comprising the DBR. The angle of incidence for light reflected at high reflectivity (i.e., within the stopband) is proportional to the square root of the difference in index of refraction between the layers in the DBR.

By using a pair of materials with a large difference in index of refraction such as AlN and AlSb as separate layers in the DBR, both a wider stopband and a larger usable range of angles of incidence can be achieved. Accordingly, a distributed Bragg reflector can be made comprising a plurality of layer pairs, wherein each pair comprises a first layer comprising AlN and a second layer comprising AlSb. The pairs can also be reversed such that the first layer comprises AlSb and the second layer comprises AlN. Each layer has a thickness of $\lambda/4n_i$, where $\lambda$ is the peak wavelength of an optoelectronic device, and $n_i$ is the index of refraction of that layer. In some embodiments each layer comprises a mixture of AlN and AlSb wherein the first layer contains a different ratio of AlN/(AlN+AlSb) from the second layer.

Omnidirectional Reflectors

Omni-directional reflectors (ODRs) can be used for reflecting contacts for III-V optoelectronic devices, among other applications. They are "omnidirectional" in the sense that they exhibit high reflectivity over a broad range of angles of incidence, unlike many reflecting surfaces. ODRs are precisely engineered optical components with specified layer thicknesses and specified index of refraction for that layer. The thickness of the dielectric is carefully controlled at a value of $\lambda/4n$ (where $\lambda$ is the wavelength of incident light and n is the index of refraction) in order to maximize the reflectivity. Deviations of the thickness from the target value, or in the index of refraction from the expected value, will degrade the reflectivity of the ODR. The dielectric layer thickness is chosen to be $\lambda/4n$ to achieve high reflectivity at the emitted wavelength of the device and at all angles of incidence to the interface between the semiconductor and the dielectric.

While this version of an ODR is an elegant optical solution, it relies on interference effects which change when the thickness of the dielectric layer or its index of refraction is either higher or lower than the designed value. Deviations of the thickness from the target value or deviations in the index of refraction from the expected value will degrade the reflectivity of the ODR. As a result, manufacturing the ODR is challenging. Similarly, if the emitted light deviates from the target wavelength $\lambda$, reflectivity can be reduced, again because the design thickness of the layer will be incorrect for the actual wavelength emitted. Further, the manufacture of ODRs involves significant processing including: depositing dielectrics with specified thickness and optical properties, constructing vias to provide electrical connection from the semiconductor to the metallic layer (through the ODR layer), and removing the substrate. The vias are used in devices where the (nonconductive) ODR is positioned adjacent to a semiconductor layer in order to reflect light back into the semiconductor layer, and for which it is also necessary to make electrical contact. An array of vias filled with a conductor is disposed in the (nonconducting) ODR layer to provide sufficient current paths to connect an electrode layer to the semiconductor layer through the ODR.

Two non-limiting embodiments of an ODR are described here; in both cases the modified ODR relies on alloys comprising AlN and AlSb as described above, engineered to have specific optical properties for a reflector. The novel ODRs are less exacting to construct and do not rely on interference effects. These novel ODRs also do not depend on layer thicknesses or the wavelength of the reflected light.

In some embodiments, an insulating layer is disposed between a semiconductor layer and a conductor. The insulating layer comprises an alloy of AlN and AlSb wherein the composition is selected to provide refractive index matching to the semiconductor layer and high transmissivity through the interface and the insulating layer at the operating wavelengths of the device. The light is transmitted through the insulating layer to a conducting layer (e.g., a metal layer) which can also serve as a high reflectivity layer. The ODR comprises the insulating layer and the conducting layer. Ag and Al are examples of metals that can provide both good conductivity and high reflectivity at typical operating wavelengths with little or no wavelength sensitivity. Light is reflected back through the index matched dielectric layer into the semiconductor layer. If electrical connection between a portion of the conducting layer and the semiconductor layer is required, an array of vias can be provided as described for prior art omnidirectional reflectors.

In some embodiments, a conductive layer comprising a doped alloy of AlN and AlSb can be substituted for the insulating layer. The doped alloy was described above for transparent conductors. The structure is the same as for the embodiments using an insulating layer except that use of a conductive layer obviates the need for conductive vias in the construction of the ODR. The ODR comprises the conductive alloy layer and the conducting layer. Such conductive layers need only have sufficient conductivity to provide adequate current flow through the thickness of the transparent conducting layer to a more conductive contact layer which, in turn, provides low resistance for lateral current flow. At the same time, the composition of the alloy can be selected to provide index matching to the semiconductor layer and high transmissivity at the operating wavelengths of the device.

EXAMPLES

Example 1

Index of Refraction and Extinction Coefficient for Selected Materials

Figure 2:
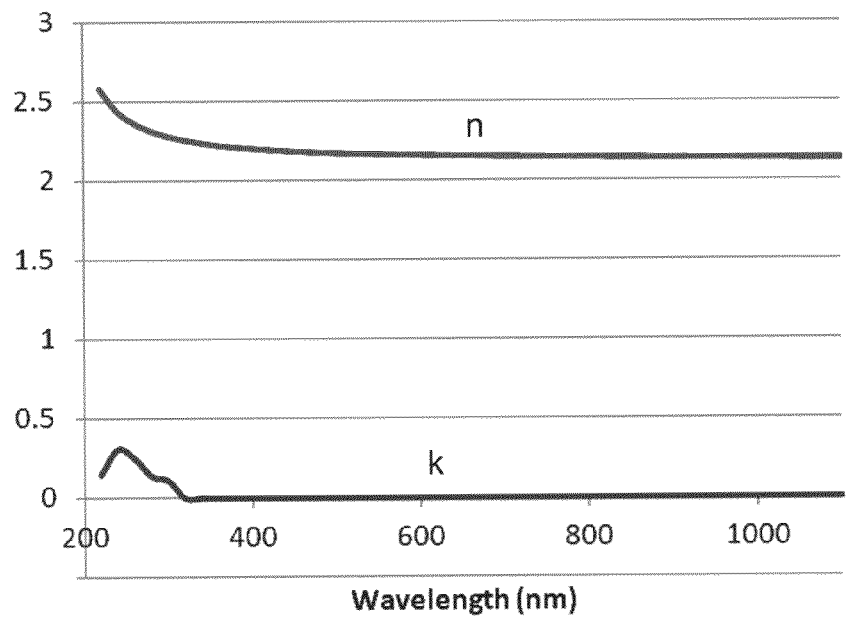
FIG. 2 shows index of refraction and extinction coefficient for AlN as a function of wavelength.
Figure 3:
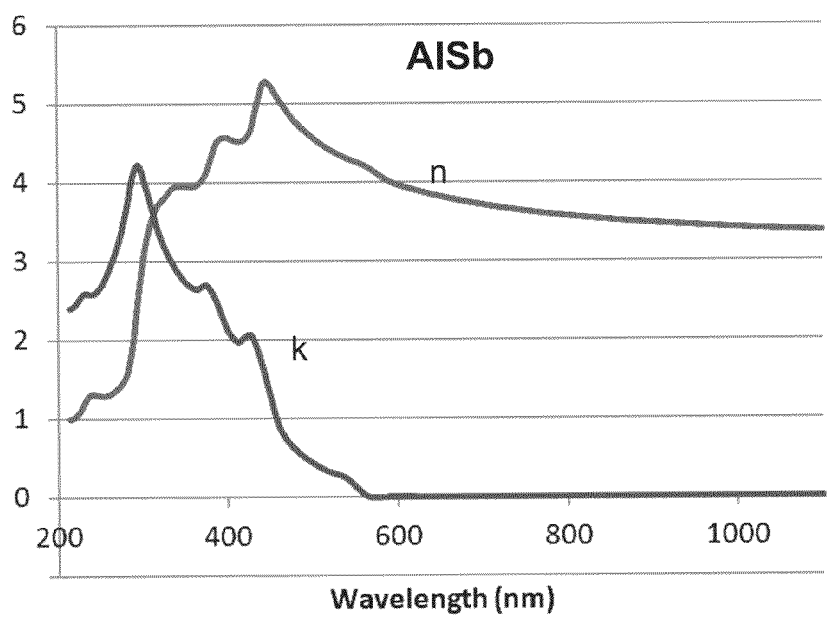
FIG. 3 shows index of refraction and extinction coefficient for AlSb as a function of wavelength.
Figure 4:
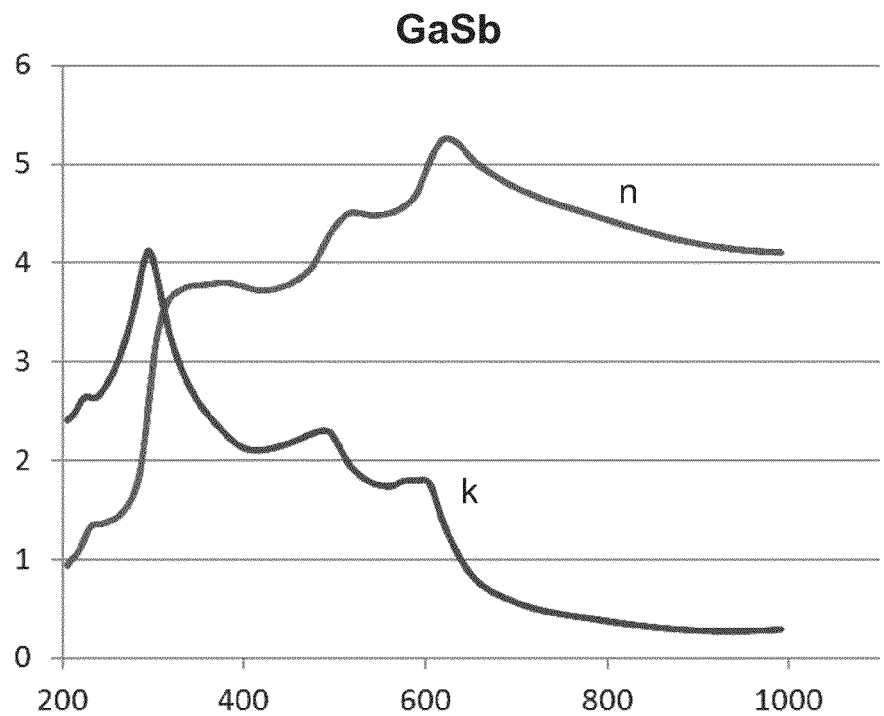
FIG. 4 shows index of refraction and extinction coefficient for GaSb as a function of wavelength.

FIG. 2 shows the index of refraction n and extinction coefficient k as a function of wavelength for AlN. FIG. 3 shows the same quantities for AlSb. FIG. 4 shows the same quantities for GaSb. Note that for AlN and AlSb, k=0 for wavelengths greater than ~300 nm and ~580 nm, respectively. For GaSb in the range shown, there is no wavelength for which k=0. GaSb therefore is not useful as a transparent material at these wavelengths; for example, it will absorb light generated by a red or infrared laser or LED. Above about 580 nm, both AlN and AlSb have negligible absorption, and layers of these materials have high transparency. An alloy of AlSb and AlN is similarly transparent above about 580 nm, and a compositionally tunable dielectric with tunable dielectric constant and index of refraction can be made. Alloys containing a small percentage (e.g., <5%) of AlSb can also be used as refractive index matching materials have negligible absorption (extinction coefficient of less than about 0.02) at wavelengths shorter than 580. The material also has a relatively high bandgap and low conductivity when undoped.

Figure 5:
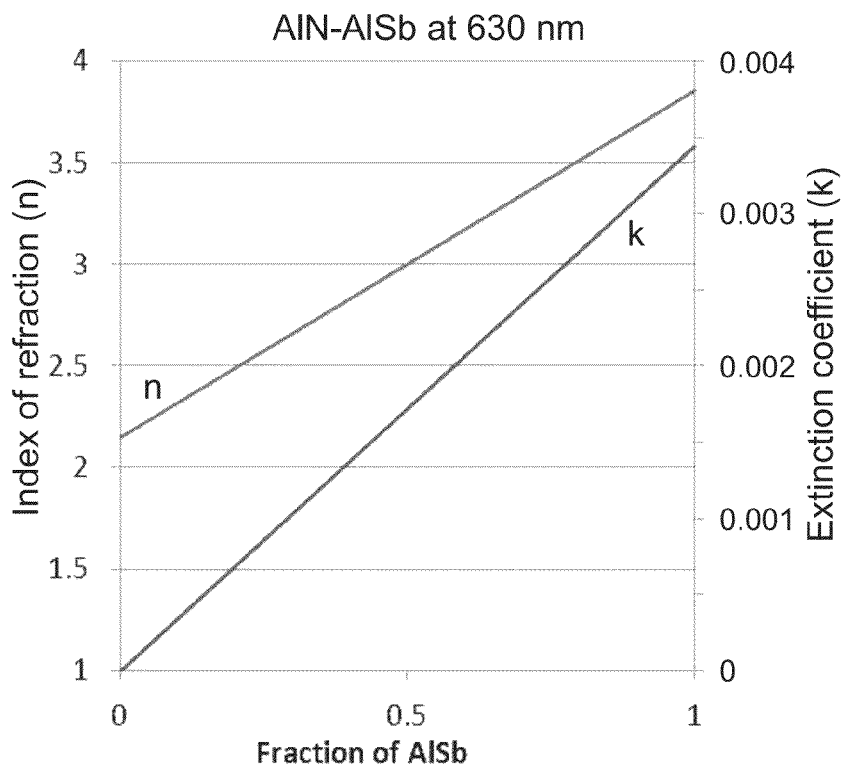
FIG. 5 shows the calculated index of refraction and extinction coefficient for alloys of AlN and AlSb as a function of fraction of AlSb at a wavelength of 630 nm.

FIG. 5 shows calculated values of n and k at 630 nm (a typical red LED or red laser wavelength) for the AlN—AlSb alloy system with compositions (mole fraction) ranging from pure AlN to pure AlSb. The calculated n and k are from a simple weighted average of the AlN and AlSb n and k values; actual alloys may have measured n and k values that differ slightly from these calculated values, but the calculation serves as a guide for alloy compositions of interest for different target values of the index of refraction. Specifically, the ability to tune the index of refraction in the vicinity of 3.3 (the index of refraction for many of the III-V semiconductors, including GaAs and AlGaInP) with negligible extinction coefficient is useful for III-V based optoelectronic devices, such as LEDs and lasers. For example, an alloy consisting of about 35 mole % AlN and about 65 mole % AlSb provides a good candidate for refractive index matching for III-V semiconductors.

Figure 6:
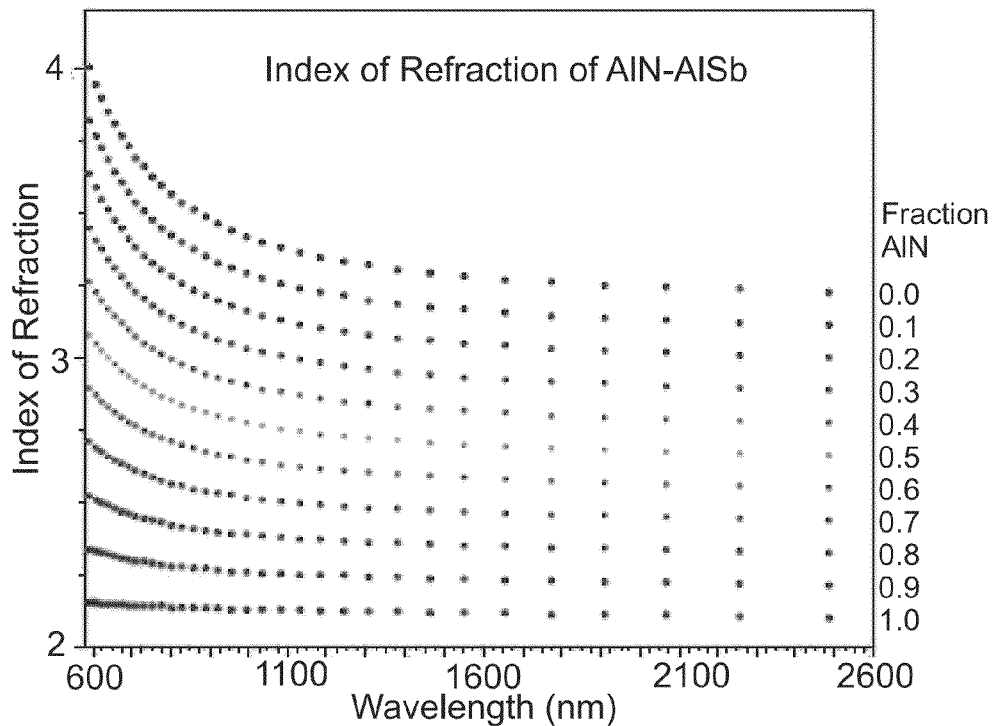
FIG. 6 shows the calculated index of refraction for alloys of AlN and AlSb as a function of wavelength for various alloy compositions.
Figure 7:
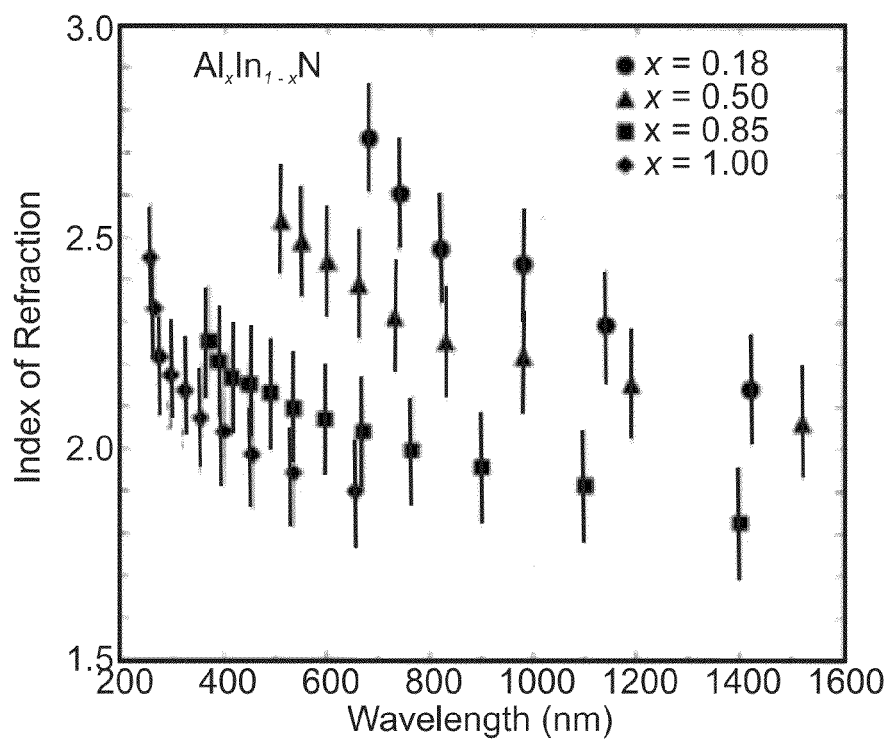
FIG. 7 shows the measured index of refraction for alloys of AlN and InN as a function of wavelength for various alloy compositions.

FIG. 6 is a plot of the calculated index of refraction for the wavelength range 580 to 2600 nm, where the extinction coefficient is negligible, for alloy fractions ranging from 0 to 1 of AlN in AlSb. The calculated n values indicate that the AlN—AlSb alloy system will be tunable and useful into the infrared portion of the spectrum in addition to the visible portion of the spectrum. While experimental values for the AlN—AlSb alloy system were not measured, the calculated behavior shown in FIG. 6 is similar to measurements reported by Peng et al. (*Appl Phys Lett* 71, 17, 1997) for the $Al_xIn_{1-x}N$ system. FIG. 7 shows the experimentally determined refractive index from Peng et al. for values of x=0.18, 0.5, 0.85 and 1.0 in the $Al_xIn_{1-x}N$ ternary system plotted as a function of wavelength. Each material exhibits a smooth curve as a function of wavelength.

Example 2

Bandgap for Selected Materials

Figure 8:
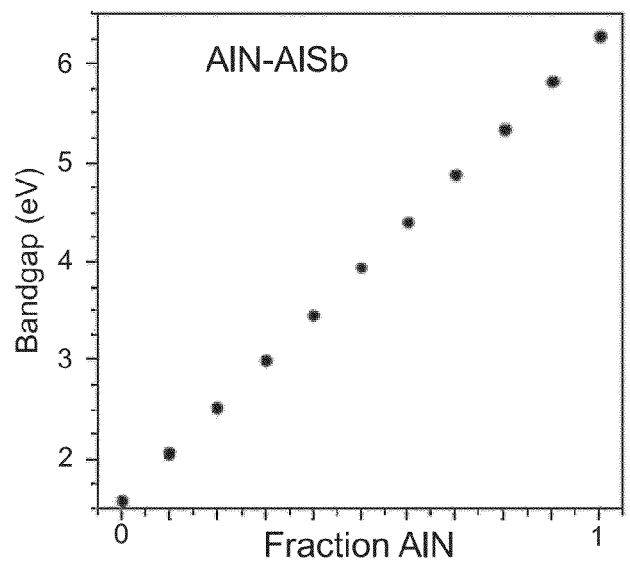
FIG. 8 shows the calculated bandgap for alloys of AlN and AlSb as a function of fraction of AlN.
Figure 9:
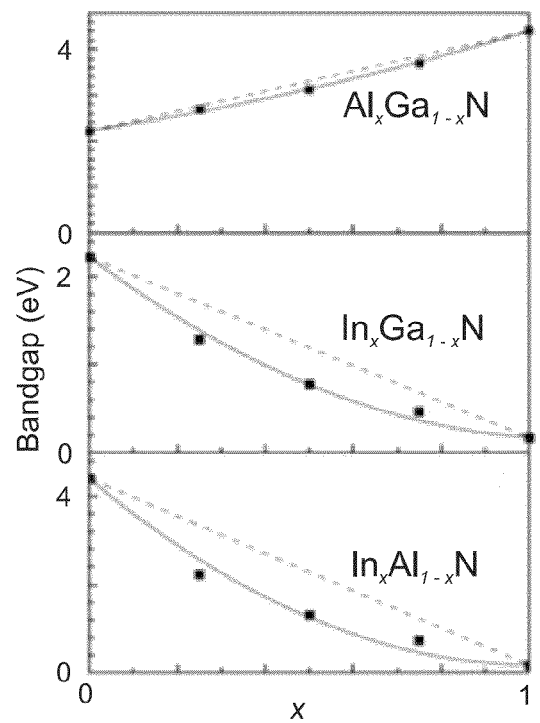
FIG. 9 shows the measured bandgap for alloys of AlN—GaN, InN—GaN, and InN—AlN as a function of alloy composition.

FIG. 8 shows a plot of the calculated bandgap for the AlN—AlSb alloy system, using a simple weighted average of the AlN and AlSb n and k values. It should be noted that linear interpolation of binary alloy bandgaps from a weighted average of the constituent bandgaps typically underestimates the alloy bandgap, especially at approximately equal compositions. This deviation is commonly referred to as "bowing," because the measured bandgap trend is bowed below the linear relationship shown in FIG. 8. This bowing is shown for three other systems in FIG. 9 for $Al_xGa_{1-x}N$, $In_xGa_{1-x}N$, and $In_xAl_{1-x}N$ (from Dridi et al., *Semicond. Sci. Technol.* 18, 850-56, 2003). The differences can affect the selection of a particular alloy for a particular application, but the trends are monotonic and the deviations from linear are small enough that they are not important, especially when material selection is based on a target index of refraction. Using the graph in FIG. 8, compositions have a desired bandgap can be chosen for specific applications.

It will be understood that the descriptions of one or more embodiments of the present invention do not limit the various alternative, modified and equivalent embodiments which may be included within the spirit and scope of the present invention as defined by the appended claims. Furthermore, in the detailed description above, numerous specific details are set forth to provide an understanding of various embodiments of the present invention. However, one or more embodiments of the present invention may be practiced without these specific details. In other instances, well known methods, procedures, and components have not been described in detail so as not to unnecessarily obscure aspects of the present embodiments.

What is claimed is:

1. An optoelectronic device comprising a first component and a second component;
   wherein the first component comprises a semiconductor,
   wherein the second component comprises an alloy of AlN and AlSb having a refractive index substantially the same as that of the first component,
   wherein the second component has a negligible extinction coefficient at wavelengths of light used in the optoelectronic device, and
   wherein the first component is in optical contact with the second component,
   wherein the semiconductor comprises GaAs or AlGaInP and the alloy consists of about 35 mole % AlN and about 65 mole % AlSb.

2. The optoelectronic device of claim 1, wherein the second component is operable as a transparent insulator.

3. The optoelectronic device of claim 1, wherein the second component is operable as a transparent conductor.

4. The optoelectronic device of claim 3, wherein the alloy further comprises a dopant, wherein the dopant is present in sufficient concentration to make the alloy conductive.

5. The optoelectronic device of claim 4, wherein the dopant provides n-type conductivity to the alloy.

6. The optoelectronic device of claim 4, wherein the dopant provides p-type conductivity to the alloy.

7. The optoelectronic device of claim 1, wherein the second component is deposited by physical vapor deposition, atomic layer deposition or chemical vapor deposition.

8. The optoelectronic device of claim 1, wherein the optoelectronic device is a light-emitting device or a light-sensing device.

9. The optoelectronic device of claim 1, further comprising a metal layer,
wherein the second component is a layer disposed adjacent to and in optical contact with the metal layer, and
wherein the second component is disposed between the first component and the metal layer.

10. The optoelectronic device of claim 9, wherein a set of conductive vias is disposed in the second component to provide conductivity between the metal layer and the first component.

11. The optoelectronic device of claim 9, wherein the alloy is conductive.

12. The optoelectronic device of claim 9, wherein the metal layer comprises Ag or Al.

13. A method of making an optoelectronic device comprising
forming a first component comprising a semiconductor material, and
forming a second component comprising an alloy of AlN and AlSb in optical contact with the first component,
wherein the second component has a refractive index substantially the same as that of the first component, and has a negligible extinction coefficient at wavelengths of light emitted or detected by the optoelectronic device,
wherein the semiconductor comprises GaAs or AlGaInP and the alloy consists of about 35 mole % AlN and about 65 mole % AlSb.

14. The method of claim 13, wherein the second component further comprises a dopant sufficient to make the alloy conductive.

* * * * *